United States Patent
Yang

(10) Patent No.: US 8,704,296 B2
(45) Date of Patent: Apr. 22, 2014

(54) TRENCH JUNCTION FIELD-EFFECT TRANSISTOR

(75) Inventor: Robert Kuo-Chang Yang, Campbell, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/408,212

(22) Filed: Feb. 29, 2012

(65) Prior Publication Data

US 2013/0221429 A1    Aug. 29, 2013

(51) Int. Cl.
*H01L 29/66*    (2006.01)

(52) U.S. Cl.
USPC ............. 257/330; 257/331; 257/66; 257/139; 257/409; 257/371

(58) Field of Classification Search
USPC ..................... 257/330–331, 66, 139, 409, 371
See application file for complete search history.

(56) References Cited

U.S. PATENT DOCUMENTS

| | | | |
|---|---|---|---|
| 5,285,369 A | 2/1994 | Balakrishnan | |
| 5,313,381 A | 5/1994 | Balakrishnan | |
| 6,078,090 A * | 6/2000 | Williams et al. | 257/476 |
| 6,353,252 B1 | 3/2002 | Yasuhara et al. | |
| 6,590,240 B1 | 7/2003 | Lanois | |
| 6,717,230 B2 | 4/2004 | Kocon | |
| 6,878,993 B2 * | 4/2005 | Yilmaz | 257/330 |
| 6,903,413 B2 | 6/2005 | Lanois | |
| 7,033,891 B2 | 4/2006 | Wilson et al. | |
| 7,078,783 B2 | 7/2006 | Lanois | |
| 7,368,777 B2 * | 5/2008 | Kocon | 257/302 |
| 7,535,057 B2 | 5/2009 | Yang | |
| 7,745,883 B2 * | 6/2010 | Williams et al. | 257/371 |
| 7,829,944 B2 * | 11/2010 | Disney | 257/331 |
| 7,898,009 B2 * | 3/2011 | Wilson et al. | 257/278 |
| 8,080,848 B2 | 12/2011 | Darwish et al. | |
| 8,193,570 B2 * | 6/2012 | Sapp et al. | 257/301 |
| 8,415,671 B2 * | 4/2013 | Zhang | 257/66 |
| 2003/0232477 A1 | 12/2003 | Deboy et al. | |
| 2005/0133858 A1 * | 6/2005 | Banerjee et al. | 257/327 |
| 2005/0169041 A1 * | 8/2005 | Wang | 365/154 |
| 2006/0043474 A1 * | 3/2006 | Kinzer et al. | 257/330 |
| 2006/0065924 A1 * | 3/2006 | Yilmaz | 257/328 |
| 2006/0118833 A1 | 6/2006 | Lanois | |
| 2006/0157745 A1 | 7/2006 | Lanois | |
| 2006/0157818 A1 * | 7/2006 | Williams et al. | 257/511 |
| 2006/0205196 A1 | 9/2006 | Lanois | |
| 2007/0262398 A1 | 11/2007 | Darwish | |

(Continued)

FOREIGN PATENT DOCUMENTS

| | | |
|---|---|---|
| EP | 1073123 A2 | 1/2001 |
| JP | 63-296282 A | 12/1988 |

*Primary Examiner* — Fernando L Toledo
*Assistant Examiner* — Mohammed Shamsuzzaman
(74) *Attorney, Agent, or Firm* — Brake Hughes Bellermann LLP

(57) ABSTRACT

In a general aspect, a semiconductor device can include a gate having a first trench portion disposed within a first trench of a junction field-effect transistor device, a second trench portion disposed within a second trench of the junction field-effect transistor device, and a top portion coupled to both the first trench portion and to the second trench portion. The semiconductor device can include a mesa region disposed between the first trench and the second trench, and including a single PN junction defined by an interface between a substrate dopant region having a first dopant type and a channel dopant region having a second dopant type.

21 Claims, 12 Drawing Sheets

Cut Along Line E shown in FIG. 1A

(56) References Cited

U.S. PATENT DOCUMENTS

| | | |
|---|---|---|
| 2008/0138954 A1* | 6/2008 | Cai .............................. 438/285 |
| 2010/0123171 A1 | 5/2010 | Yang |
| 2011/0169103 A1* | 7/2011 | Darwish et al. ............... 257/409 |
| 2011/0193131 A1* | 8/2011 | Blanchard et al. ............ 257/139 |
| 2011/0193142 A1 | 8/2011 | Ring |
| 2011/0221421 A1* | 9/2011 | Williams ................... 324/76.11 |
| 2011/0254010 A1* | 10/2011 | Zhang ............................. 257/66 |
| 2012/0256250 A1* | 10/2012 | Schulze et al. ................ 257/328 |
| 2013/0221430 A1* | 8/2013 | Yilmaz et al. ................. 257/330 |

* cited by examiner

Cut Along Line F and Centered about A shown in FIG. 1A

US 8,704,296 B2

TRENCH JUNCTION FIELD-EFFECT TRANSISTOR

TECHNICAL FIELD

This description relates to methods and apparatus for a junction field-effect transistor (JFET).

BACKGROUND

Known junction field-effect transistor (JFET) devices manufactured using known semiconductor processing techniques can have a relatively large circular footprint within a semiconductor die. Often these known JFET devices are separately manufactured in different areas of a layout from other semiconductor devices such as metal-oxide-semiconductor field-effect transistors (MOSFETs). Because the JFET devices can be in completely separate areas of the die from MOSFET devices, the overall layout of the die can have undesirable inefficiencies. Thus, a need exists for systems, methods, and apparatus to address the shortfalls of present technology and to provide other new and innovative features.

SUMMARY

In a general aspect, a semiconductor device can include a gate having a first trench portion disposed within a first trench of a junction field-effect transistor device, a second trench portion disposed within a second trench of the junction field-effect transistor device, and a top portion coupled to both the first trench portion and to the second trench portion. The semiconductor device can include a mesa region disposed between the first trench and the second trench, and including a single PN junction defined by an interface between a substrate dopant region having a first dopant type and a channel dopant region having a second dopant type.

In another general aspect, an apparatus can include a source, and a gate electrically isolated from the source where the gate has a trench portion disposed within a first trench of a junction field-effect transistor device and has a trench portion disposed within a second trench of the junction field-effect transistor device. The apparatus can include a member disposed within the first trench and capacitively coupled to the trench portion of the gate disposed within the first trench. The member can have a trench width less than a trench width of the trench portion of the gate disposed within the first trench, and a channel dopant region in contact with the source and continuously extending into a mesa region disposed between the first trench and the second trench.

In yet another general aspect, an apparatus can include a gate of a junction field-effect transistor coupled to a gate oxide, and a P-type substrate of the junction field-effect transistor. The apparatus can also include an N-type dopant region disposed between the gate oxide and the P-type substrate, the N-type dopant region being in contact with the gate oxide.

The details of one or more implementations are set forth in the accompanying drawings and the description below. Other features will be apparent from the description and drawings, and from the claims.

DETAILED DESCRIPTION

Figure 1A:
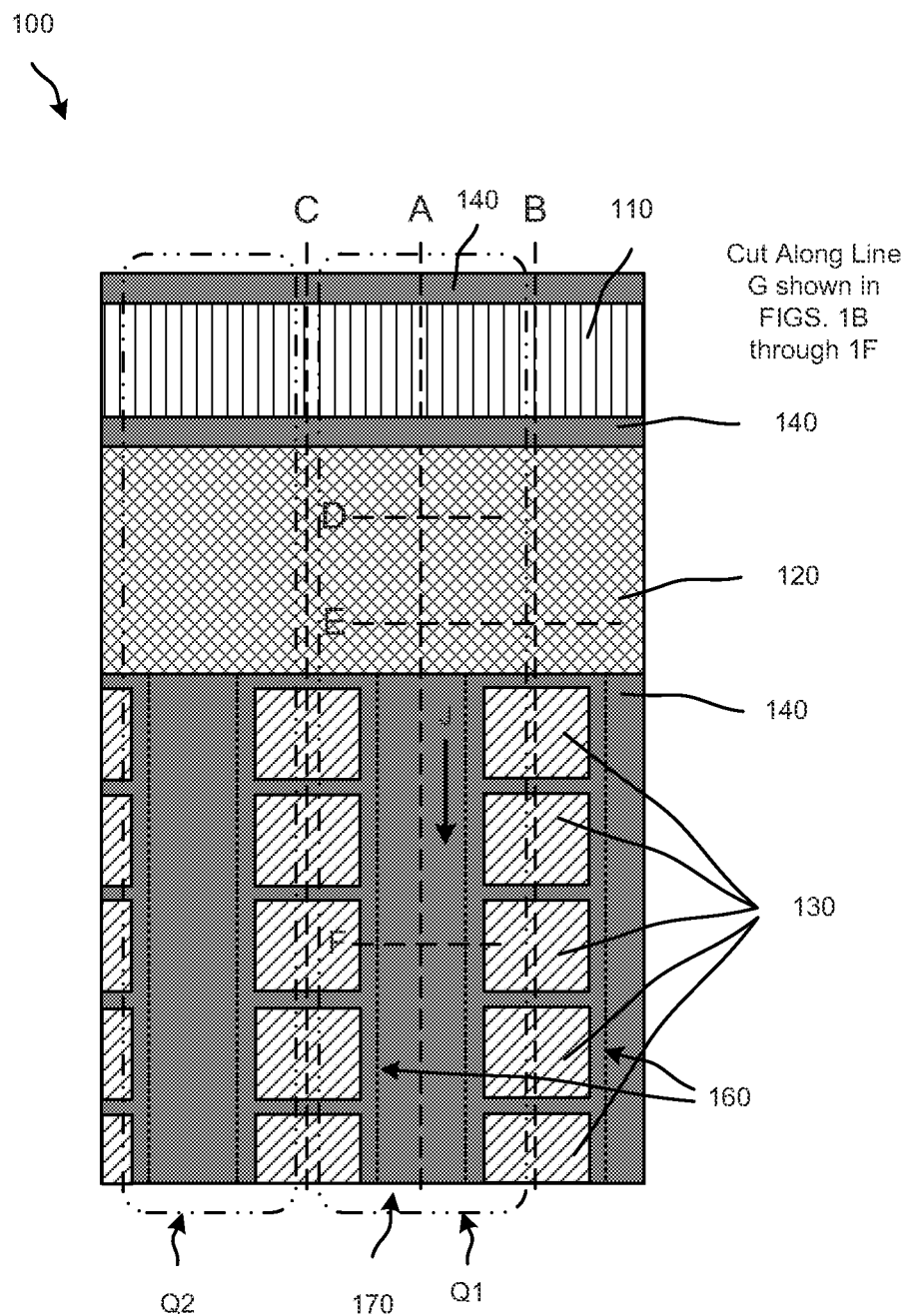
FIGS. 1A through 1F are cross-sectional diagrams that illustrate various views of junction field-effect transistor (JFET) devices.

FIGS. 1A through 1F are cross-sectional diagrams that illustrate various views of junction field-effect transistor (JFET) devices Q1, Q2. Specifically FIG. 1A is a cross-sectional diagram that illustrates a top view of the JFET devices Q1, Q2, according to an embodiment. Because many of the features of portions of the JFET device Q1, Q2 are identical, the features within the semiconductor die 100 will, in most instances, be described in terms of a portion of the JFET device Q1. The top view of the JFET devices Q1, Q2 shown in FIG. 1A are cut a long line G, which is shown in FIGS. 1B through 1F.

The cross-sectional diagrams illustrated in FIGS. 1A through 1F are representative drawings. Processing variations, variations in aspect ratios, differences in design dimensions, and/or so forth can result in different shapes and/or non-idealities than those shown in FIGS. 1A through 1F. In some embodiments, the doping concentrations (or dopant types (e.g., N-type, P-type)) discussed in connection with FIGS. 1A through 1F can be changed (e.g., reversed) and/or varied.

As shown in FIG. 1A, JFET device Q1 includes a source 110 and a gate 120. In some embodiments, the source 110 can be, or can include, a source contact (which can include a conductive material), a doped semiconductor (e.g., a P-type doped semiconductor, an N-type doped semiconductor), and/or so forth. The gate 120 is disposed over trenches 160 including oxide 140 (that can function as an insulating layer, for example, within the trenches 160) and members 130 (e.g., conductive members that are capacitively coupled with at least a portion of the gate 120), referred herein after as "member" or "members". Because the trenches 160 are below the surface of the oxide 140, profiles of the trenches 160 are illustrated with dashed lines. The trenches 160 of JFET device Q1 are aligned along and centered approximately about, respectively, an axis represented by line B and an axis represented by line C. In this embodiment, the members 130 are electrically insulated from one another by the oxide 140 and are capacitively coupled to the gate 120 (and one another).

In some embodiments, oxide 140 disposed within the trenches 160 can be referred to as trench oxide. Portions of the oxide 140 disposed within the trenches 160 can be formed using one or more processes and/or processing steps that are different from those used to form portions of the oxide 140 above the trenches 160. In some embodiments, the oxide 140 (or portions thereof) can be, or can include, $SiO_2$, $Si_3N_4$, and/or so forth. In some embodiments, the oxide 140 can be, or can include, a relatively high K or tow K dielectric. In some embodiments, because the trenches 160 can be the same as, or similar to, trenches associated with a lateral floating capacitively coupled (LFCC) metal-oxide-semiconductor field-effect transistor (MOSFET) device, the trenches 160 can be referred to as LFCC trenches. In some embodiments, the LFCC device can also be referred to as a lateral floating coupled capacitor device.

In some embodiments, the source 110 and/or the gate 120 can be made of, or can include, a conductive material such as a metal (e.g., aluminum, copper), a polysilicon material (e.g., a tow-pressure chemical-vapor deposition (LPCVD) polysilicon, an N-type polysilicon, a P-type polysilicon), and/or so forth. In some embodiments, the oxide 140 can include any combination of thermally grown oxide, deposited oxide, and/or so forth. In some embodiments, the members 130 can be made of a conductive material such as a polysilicon material, a metal aluminum), a silicide (e.g., a cobalt silicide, a platinum silicide), and/or combinations thereof.

In this embodiment, current can flow along direction J from the source 110 of the JFET device Q1 and beneath the gate 120 of the JFET device Q1 in response to a potential being applied between the source 110 and a drain (not shown) (also can be referred to as a drain contact). In some embodiments, the drain can be, or can include, a drain contact (which can include a conductive material), a doped semiconductor (e.g., a P-type doped semiconductor, an N-type doped semiconductor), and/or so forth. The current can flow within a channel (not shown in FIG. 1A) below the oxide 140 and between the trenches 160 of the JFET device Q1. Current can flow along direction J (shown in a downward direction) within the channel between the source 110 and the drain of the JFET device Q1 so long as a gate-to-source voltage (Vgs) (which also can be referred to as a bias voltage) applied between the gate 120 and source 110 of the JFET device Q1 is greater than a threshold voltage (e.g., is greater than a negative threshold voltage). In response to the gate-to-source voltage (Vgs) less than the threshold voltage (e.g., less than a negative threshold voltage) being applied, at least a portion of the channel can be changed from a conductive state to a depleted state (e.g., a current-limiting, a resistive state, a pinched-off state, a low conduction state, a zero conduction or current flow state). In some embodiments, when the gate-to-source voltage (Vgs) is less than the threshold voltage, current flow within the channel (e.g., channel dopant region) can be terminated. Although not shown in this embodiment, the channel can have a doping (e.g., P-type doping) so that the channel can be in a conductive state when the gate-to-source voltage (Vgs) is less than a threshold voltage and can be in a depleted state when the gate-to-source voltage is greater than the threshold voltage.

In some embodiments, when at least a portion of the channel is in a depleted state, the portion of the channel can be depleted (e.g., depleted of charge carriers, depleted of N-type charge carriers) in response to the gate-to-source voltage applied between the gate 120 and the source 110. In other words, the channel within the mesa region 170 between the trenches 160 of the JFET device 1 can be depleted to cause pinch off of the channel and prevent (e.g., substantially prevent) flow of current within the channel between the source 110 and the drain (not shown)

Figure 1B:
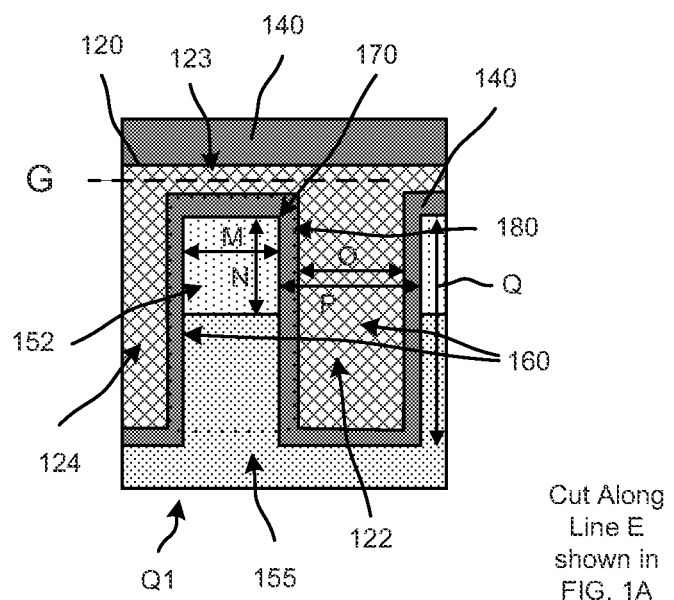

FIG. 1B is a cross-sectional diagram that illustrates a portion of the diagram shown in FIG. 1A cut along the line E. As shown in FIG. 1B, the trenches 160 of JFET device 1 are separated by the mesa region 170. The mesa region 170 can have an N-type dopant region 152 (also can be referred to as an N-type dopant region or as a channel dopant region) and a P-type dopant region 155 (also can be referred to as a P-type dopant region or as a substrate dopant). The N-type dopant region 152 can have least a portion that functions as a channel of the JFET device Q1 through which current can flow when a potential is applied between the source 110 and the drain of the JFET device Q1. Accordingly, at least a portion of the mesa region 170 can define a conductive channel for the JFET device Q1. With the orientation of the JFET device Q1 shown in FIG. 1B, current through the conductive channel can flow from the source 110 (not shown in FIG. 1B) out of the page through the N-type dopant region 152 below the gate 120 and above the P-type dopant region 155. In some embodiments, the P-type dopant region 155 can be referred to as a substrate dopant region. As shown in FIG. 1B, only one type of dopant (the N-type dopant region 152) is disposed between the substrate, which includes the P-type dopant region 155, and a portion of the oxide 140 below the gate 120. In some embodiments, the N-type dopant can be referred to as a first dopant type, and the P-type dopant can be referred to as a second dopant type, and vice versa.

As illustrated in FIG. 1B, a width M of the mesa region 170 can define (e.g., approximately define) a width of the channel (e.g., channel dopant region) of the JFET device Q1. Also, a height N of the N-type dopant region 152 can define (e.g., approximately define) a height of the channel of the JFET device Q1. The width M and height N of the mesa region 170 can have a typical range of approximately 0.01 μm to 20 μm. In some embodiments, the height N can be greater than or equal to the width M. In some embodiments, the height N can be less than the width M.

As illustrated in FIG. 1B, the trenches 160 can have approximately a depth Q. As shown in FIG. 1B, the depth Q can be more than or equal to 2 times the height N of the N-type dopant region 152. In some embodiments, the depth Q can be less than 2 times the height N of the N-type dopant region 152. Typically, the depth Q of the trenches 160 can have a range of approximately 0.01 μm to 20 μm.

In some embodiments, the width M can be less than or equal to the width O of the trench portion 122 of the gate 120 and/or less than or equal to the width P of the trenches 160. In some embodiments, the width M can be greater than the width O of the trench portion 122 of the gate 120 and/or greater than the width P of the trenches 160.

As shown in FIG. 1B, the gate 120 is disposed around (or defines at least a portion of a boundary of) an interior region 180 (approximately illustrated by a dotted boundary) that includes at least a portion of the N-type dopant region 152 and at least a portion of the P-type dopant region 155. A portion of the interior region 180 that includes (or corresponds with) the N-type dopant region 152 can be referred to as the N-type portion of the interior region 180, and a portion of the interior region that includes (or corresponds with) the P-type dopant region 155 can be referred to as the P-type portion of the interior region 180. The gate 120 includes a top portion 123 and trench portions 122, 124 (disposed within the trenches 160) that define (e.g., that have interior surfaces that define) the boundaries of the interior region 180 (which can have a volume approximately defined by the gate 120 (and/or an insulating layer (e.g., oxide 140))). Accordingly, the gate 120 has approximately an arch shape, a U-shape, or a horseshoe shape. The mesa region 170 (e.g., the N-type dopant region 152 and the P-type dopant region 155) is insulated from the gate 120 by the oxide 140. In some embodiments, the gate 120 can have a different shape or profile than that shown in FIG. 1B. For example, the ratio of the thickness of the top portion 123 of the gate 120 to the thicknesses of the trench portions 122, 124 of the gate 120 can be different than that shown in FIG. 1B. As another example, in some embodiments, at least a portion of the gate 120 can form a rounded shape, or the aspect ratio of width M to depth Q can be different than that shown in FIG. 1B.

Although illustrated in FIG. 1B as having approximately equal size and dimensions, the trench portion 122 and the trench portion 124 can have different dimensions. For example, the trench portion 122 and the trench portion 124 can have different depths, different widths, different aspect ratios, etc. In some embodiments, one or more of the trench portions 122, 124 can have sloped walls, etc.

Figure 1C:
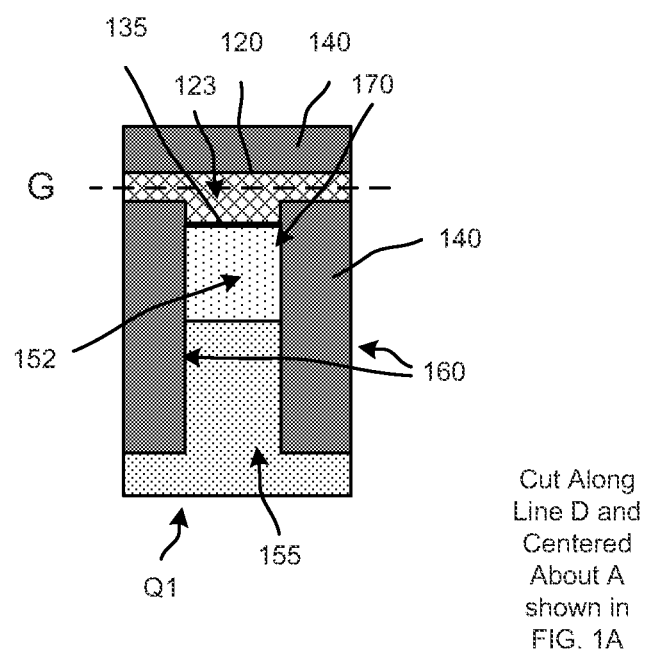

FIG. 1C is a diagram that illustrates another cross-sectional view of the gate 120 cut along the line D and centered approximately about line A. Similar to FIG. 1B, the trenches 160 of JFET device Q1 are separated by the mesa region 170 as shown in FIG. 1C. Also, the N-type dopant region 152 and the P-type dopant region 155 are shown. In this embodiment, the top portion 123 of the gate 120 is shown coupled to a gate oxide 135 of the gate 120. As shown in FIG. 1C, the top portion 123 includes a portion that extends downward to contact the gate oxide 135. In some embodiments, the gate 120 (or the top portion 123 thereof) can have a shape (e.g., a profile) different than that shown in FIG. 1C. The top portion 123 of the gate 120 is insulated from the N-type dopant region 152 by the gate oxide 135. In some embodiments, at least some portions of the gate oxide 135 can be formed using a thermally grown oxide, a deposited oxide, and/or so forth. In some embodiments, the gate oxide 135 can be, or can include, $SiO_2$, $Si_3N_4$, and/or so forth. In some embodiments, the gate oxide 135 can be, or can include, a relatively high K dielectric.

As shown in FIG. 1C, the trench portions 122, 124 of the gate 120 do not extend into (e.g., are not disposed within) the trenches 160 in association with the portion of the top portion 123 of the gate 120. In some embodiments, the portion of the top portion 123 of the gate 120 can be coupled to portions (e.g., trench portions) of the gate 120 that extend into (e.g., are disposed within) the trenches 160.

Figure 1D:
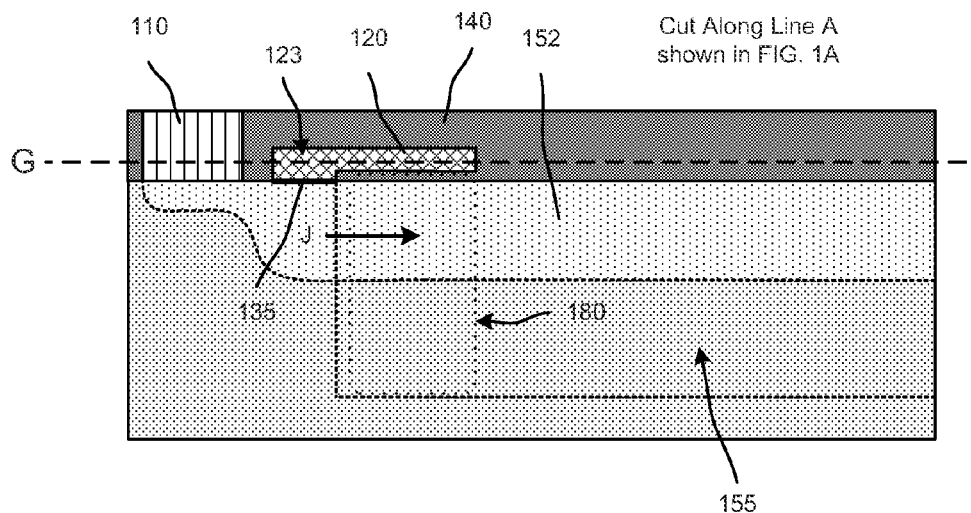

FIG. 1D is a cross-sectional diagram that illustrates a side view of the JFET device Q1 between the trenches 160. Specifically, the cross-sectional diagram of FIG. 1D is cut along line A shown in FIG. 1A. A side view of at least one of the trenches 160 is illustrated as a dashed line in FIG. 1D. As illustrated in FIG. 1D, the N-type dopant region 152 extends along the trenches 160. The N-type dopant region 152 extends continuously (without breaks or isolation regions) between the source 110, below the gate 120 the top portion 123 of the gate 120), and into the mesa region 170 between the trenches 160. The N-type dopant region 152 can have a length that is greater than or equal to a length of one or more of the trenches 160. Although not explicitly shown in FIG. 1D, the N-type dopant region 152 can include a heavily doped portion (e.g., an N+ portion) in contact with the source 110. In other words, the N-type dopant region 152 can include a heavily doped portion (e.g., an N+ portion) in a source region below and in contact with the source 110.

The N-type dopant region 152 can have least a portion that functions as a channel (e.g., channel dopant region) of the JFET device Q1 through which current can flow when a potential is applied between the source 110 and the drain (not shown) of the JFET device Q1. The source 110 is electrically isolated from the gate 120. Current, when flowing within the channel in response to the potential, can flow along direction J from the source 110, through the gate 120, and along the trenches 160 toward the drain. As shown in FIG. 1D, the top portion 123 of the gate 120 has a portion that extends into the oxide 140 and is in contact with the gate oxide 135.

In response to a gate-to-source voltage (Vgs) less than a threshold voltage (e.g., less than a negative threshold voltage) being applied, at least a portion of the channel can be changed from a conductive state to a depleted state (e.g., a current-limiting, a resistive state, a pinched-off state, a low conduction state). In some embodiments, the channel can be included in the N-type dopant region 152. In some embodiments, when the gate-to-source voltage is less than the threshold voltage, current flow within the channel can be terminated.

The interior region 180, which has a boundary that is defined (e.g., exists) at least in part by the gate 120, is shown in FIG. 1D. The interior region 180 has an area that approximately corresponds with an area of the trench portions 122, 124 (not shown in FIG. 1D) of the gate 120. In some embodiments, the portion of the channel (included in the N-type dopant region 152) that changes from the conductive state to the depleted state in response to the voltage applied to the gate 120 can be included in the N-type portion of the interior region 180. Specifically, the N-type portion of the interior region 180 of the JFET device can be depleted in response to the voltage applied to the gate 120, causing the N-type portion of the interior region 180 to change from a conductive state to a depleted state. In some embodiments, when the N-type portion of the interior region 180 has changed from the conductive state to the depleted state, other portions of the N-type dopant region 152 can remain in a conductive state. Specifically, at least some portions of the N-type dopant region 152 outside of the interior region 180 can remain in the conductive state.

As shown in FIG. 1D, the N-type dopant region 152 is contiguous between the source 110 and the gate 120 (in a horizontal direction), and is contiguous between the oxide 140 and the P-type dopant region 155 (in a vertical direction). In some embodiments, this contiguous N-type dopant region 152 can be contrasted with dopant profiles of, for example, an LFCC MOSFET device, which does not have a contiguous N-type dopant region 152 between a source and a gate and/or in a vertical direction between an insulating layer and a substrate dopant region. In some embodiments, the N-type dopant region 152 can have a dopant profile different than that shown in FIG. 1D. In this embodiment, the N-type dopant region 152 below the source 110 has a depth that is shallower than a depth of the N-type dopant region 152 below the gate 120 (e.g., below the gate oxide 135). In some embodiments, the depth of the N-type dopant region 152 can be approximately the same below the source 110 and the gate 120. In this embodiment, the N-type dopant region 152 below the source 110 can have a depth that is greater than a depth of the N-type dopant region 152 below the gate 120 (e.g., below the gate oxide 135).

Figure 1E:
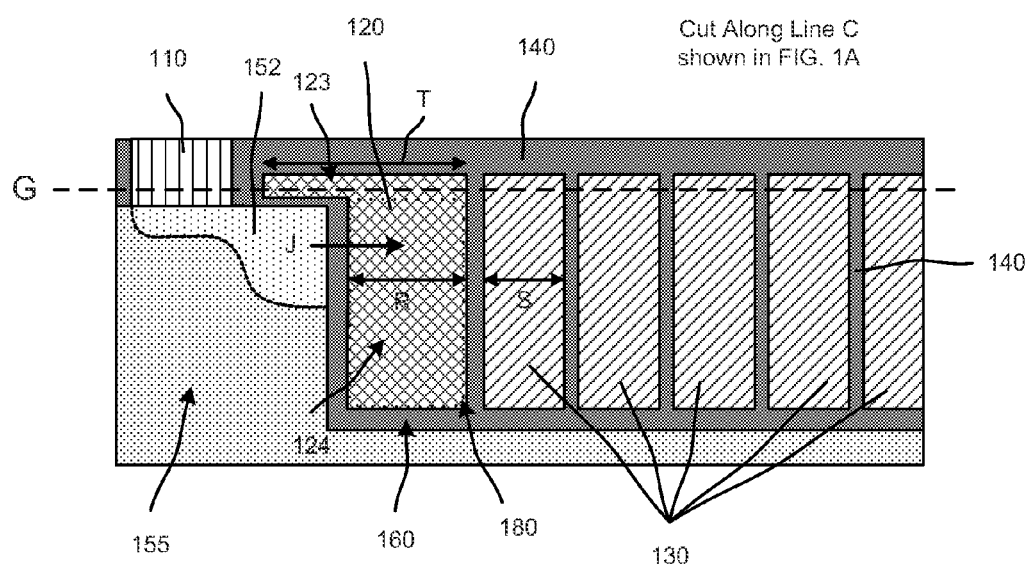

FIG. 1E is a cross-sectional diagram that illustrates aside view of the JFET device Q1 along one of the trenches 160. Specifically, the cross-sectional diagram of FIG. 1E is cut along line C shown in FIG. 1A. As illustrated in FIG. 1E, the N-type dopant region 152 is disposed between the trenches 160. Although not explicitly shown in FIG. 1D, the N-type dopant region 152 can include a heavily doped portion (e.g., an N+ portion) in contact with the source 110.

As illustrated in FIG. 1E, a P-type body region, which can typically be included in a LFCC MOSFET device, is excluded from the JFET device Q1. In other words, formation of the JFET device Q1 and can differ from formation of an LFCC MOSFET device in formation of a P-type body region in the LFCC MOSFET device but not in the JFET device Q1. In other words, the channel (or conduction) region of the JFET device Q1 includes a drift junction, similar to that of the LFCC MOSFET device, however, the body region has opposite conductivity type to the drift region that can be typically included under the LFCC MOSFET gate can be removed to form the JFET device Q1. Although not entirely visible in FIG. 1E, the N-type dopant region 152 extends continuously between the source 110, below the gate 120 (e.g., the top portion 123 of the gate 120), and into the mesa region 170 between the trenches 160

As shown in FIG. 1E, the trench portion 124 of the gate 120 has a trench width R that is greater than the trench width S of one or more of the members 130 (e.g., the capacitively coupled members). The trench width R and the trench width S can each be referred to as trench widths because the widths are aligned along the lengths of the trenches 160 from left to right between the source 110 and the drain (not shown) (or vice versa). As shown in FIG. 1E, the trench width R and the trench width S are aligned along the current flow direction between the source 110 and the drain (not shown, but oriented to the right). In some embodiments, the trench width R can be more than 2 times (e.g., three times, 5 times) the width S. The gate 120 can be used to control current through the channel more accurately because the trench width R of the trench portion 124 of the gate 120 is relatively wide.

In some embodiments, the trench width R of the trench portion 124 of the gate 120 can be approximately between less than a micrometer (μm) (e.g., 0.01 μm, 0.1 μm, 0.5 μm) and a few micrometers (e.g., 2 μm, 2.5 μm, 5 μm). In some embodiments, the trench portion 124 of the gate 120 can be greater than a few micrometers (e.g., 10 μm, 20 μm). In some embodiments, the trench portion 124 of the gate 120 can have a trench width R that is less than or equal to the trench width S of one or more of the members 130 (e.g., the capacitively coupled members).

As shown in FIG. 1E, the trench width R of the trench portion 124 of the gate 120 can be less than width of the top portion 123 of the gate. In some embodiments, the trench width R of the trench portion 124 of the gate 120 can be more than half of the width T of the top portion 123 of the gate. In some embodiments, the trench width R of the trench portion 124 of the gate 120 can be less than or equal to half of the width of the top portion 123 of the gate. In some embodiments, the trench width R of the trench portion 124 of the gate 120 can be greater than or equal to the width T of the top portion 123 of the gate. In some embodiments, the gate 120 can be used to control current through the channel more accurately when the trench width R of the trench portion 124 of the gate 120 is relatively wide than when the trench width R of the trench portion 124 of gate 120 is relatively narrow because of the increased surface area of the gate 120 around the channel (in the interior region 180).

Referring back to FIG. 1A, one or more of the trenches 160 of the JFET device Q1 can be shared with other JFET devices. For example, as shown in FIG. 1A, the trench 160 on the left side of the JFET device Q1 can be shared with the JFET device Q2. In some embodiments, one or more of the trenches 160 (or portions thereof) of the JFET device Q1 can be shared with one or more other types of devices such as LFCC MOSFET devices (e.g., double-diffused MOSFET (DMOS) devices).

Figure 1F:
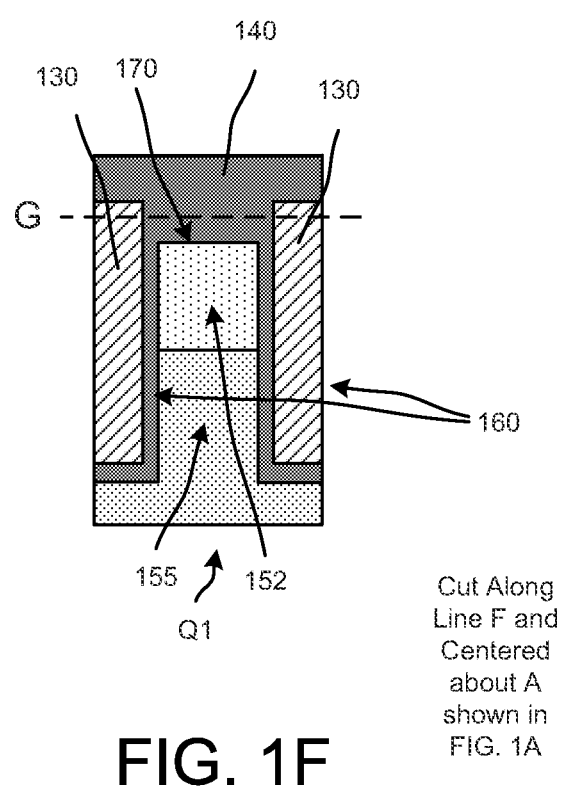

FIG. 1F is a diagram that illustrates a portion of the JFET device Q1 cut along line F and centered approximately about line A. FIG. 1F illustrates members 130 disposed within trenches 160, and illustrates the mesa region 170. FIG. 1F also illustrates the N-type dopant region 152 and the P-type dopant region 155 of the JFET device Q1. Although not shown in FIG. 1F, in some embodiments, the members 130 can be electrically coupled to one another. Specifically, a conductive material can be coupled between the member 130 shown on the right side of FIG. 1F and the member 130 shown on left side of FIG. 1F.

In some embodiments, one or more portions of the semiconductor die 100 may be implemented using various types of semiconductor processing techniques associated with semiconductor substrates including, but not limited to, for example, Silicon (Si), Germanium (Ge), Silicon Germanium (SiGe), Gallium Arsenide (GaAs), Silicon Carbide (SiC), type III-V semiconductor substrates, type III-VI semiconductor substrates, and/or so forth.

The JFET device Q1 can be used in a variety of computing applications. In some embodiments, the JFET device Q1 can be used in, for example, a power conversion integrated circuit, a computer, a personal digital assistant (PDA), a host computer, a memory component (e.g., a hard disk drive), an adaptor, an electronic measurement device, an automotive component, a data analysis device, a cell phone, an electronic device, and/or so forth.

Figure 2A:
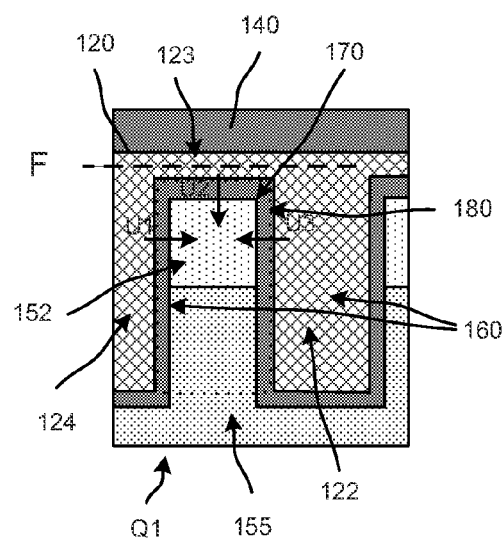
FIGS. 2A through 2D are diagrams that illustrate depletion of the channel of the JFET device shown in FIGS. 1A through 1F.

FIGS. 2A through 2D are diagrams that illustrate depletion of the channel (e.g., channel dopant region) of the JFET device Q1 shown in FIGS. 1A through 1F. FIG. 2A is a diagram that illustrates the directions of formation of a depletion region within the N-type dopant region 152. Specifically, when a bias voltage (e.g., a gate-to-source voltage) that is configured to change the channel of the JFET device Q1 from conducting state to a depleted state is applied to the gate 120 of the JFET device Q1, depletion of the N-type dopant region 152 occurs in at least the directions of U1, U2, and U3. The trench portion 124 of the gate 120 causes the deletion of the N-type dopant region 152 along approximately direction U1, the top portion 123 of the gate 120 causes depletion of the N-type dopant region 152 along approximately direction U2, and the top portion 122 of the gate 120 causes depletion of the N-type dopant region 152 along approximately direction U3. Accordingly, depletion of the N-type dopant region 152 is implemented from multiple directions (e.g., is implemented in a three-dimensional fashion). Said differently, depletion of the N-type dopant region 152 is implemented using portions of the gate 120 that are aligned in orthogonal directions. For example, top portion 123, which is used to deplete at least a portion of the N-type dopant region 152 is aligned along an axis that is orthogonal to the trench portions 122, 124, which are also used to deplete another portion of the N-type dopant region 152.

The cross-sectional diagrams illustrated in FIGS. 2A through 2D are representative drawings. Processing variations, variations in aspect ratios, differences design dimensions, and/or so forth can result in different shapes and/or non-idealities than those shown in FIGS. 2A through 2D. In some embodiments, the doping concentrations (or dopant types (e.g., N-type dopant, P-type dopant)) discussed in connection with FIGS. 2A through 2D can be changed (e.g., reversed) and/or varied.

Figure 2B:
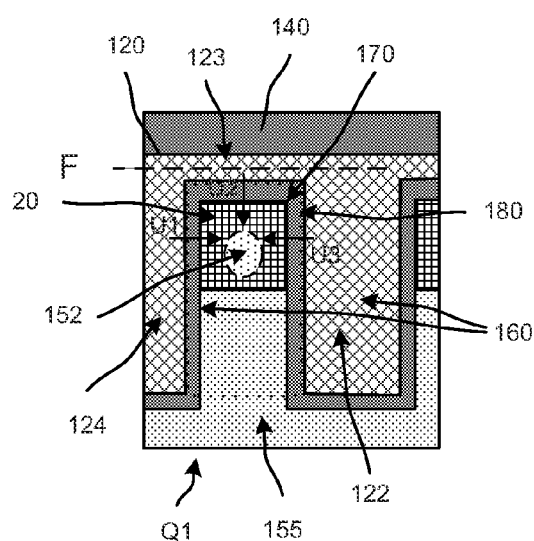

FIG. 2B is a diagram that illustrates a depletion region 20 within the N-type dopant region 152 shortly after the bias voltage has been applied to the gate 120. As illustrated in FIG. 2B, only a relatively small portion of the N-type dopant region 152 (illustrated with approximately a radial cross-sectional profile) can be used to conduct current within the JFET device Q1. In other words, the relatively small portion of the N-type dopant region 152 has a conducting portion with a cross-sectional perimeter that decreases as the N-type dopant region 152 changes from a conducting state to the depleted state.

Figure 2C:
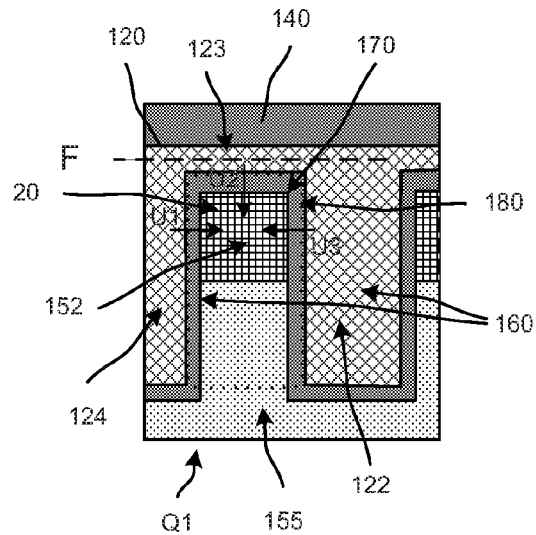

FIG. 2C is a diagram that illustrates the depletion region 20 within the N-type dopant region 152 after the entire cross-sectional area of the N-type dopant region 152 has been depleted. In this embodiment, some, or all, of the interior region 180 (and/or some volume near the interior region 180) may be depleted so that current may be prevented (or substantially prevented) from flowing within the JFET device Q1 even with a potential applied between the gate 120 and a drain (not shown).

In some embodiments, in response to a bias voltage being applied to the gate 120, holes (e.g., charge carriers from the P-type dopant region 155) can accumulate at or near an interface between the N-type dopant region 152 and the P-type dopant region 155 (e.g., substrate dopant region). In some embodiments, the interface between the N-type dopant region 152 and the P-type dopant region 155 defines a PN junction (e.g., a single PN junction within the mesa region 170). In some embodiments, the bias voltage can be greater than, equal to, or less than a threshold voltage at which the N-type dopant region 152 is entirety depleted.

In some embodiments, pinch-off control of the channel (e.g., changing of the channel to the depleted state) can be less sensitive to process variations (e.g., process variations in dopant levels, process variations in width of the mesa region 170, the width of the trenches 160) used to produce the JFET device Q1 because depletion is controlled from multiple directions. For example, the threshold voltages at which the channels in the N-type dopant regions of multiple different JFET devices change to a depleted state (e.g., are pinched off) can be the same, or substantially the same, even with relatively significant differences in dimensions of multiple different JFET devices (produced at different times or using slightly varied processing conditions).

Also, the JFET device Q1 can be less sensitive to back-gate effects associated with the substrate of the JFET device Q1. For example, the JFET device Q1 can be relatively insensitive to back gate effects associated with the P-type dopant region 155. In some embodiments, accumulation of holes at or near the interface between the N-type dopant region 152 and the P-type dopant region 155 (in response to a bias voltage being applied to the gate 120) can result in reduced back-gate effects and/or increased (e.g., more sensitive) pinch-off control.

Figure 2D:
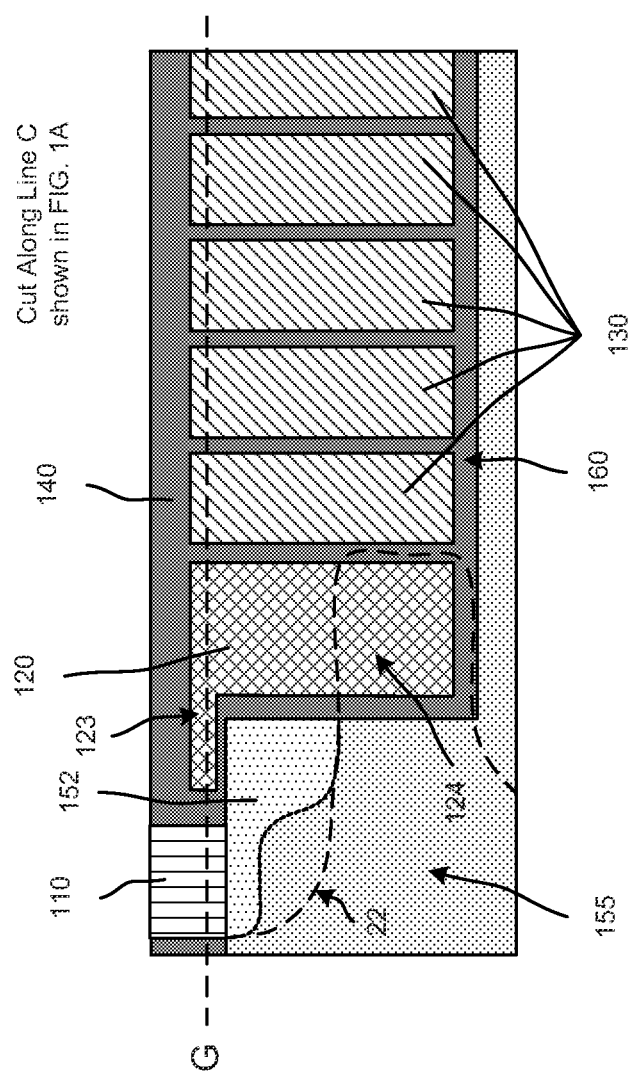

FIG. 2D is a cross-sectional diagram that illustrates a depletion profile 22 within the JFET device Q1 in response to a bias voltage. As shown in FIG. 2D, the depletion profile 22 is aligned along at least a portion of the bottom portion of the N-type dopant region 152. As shown in FIG. 2I), the depletion profile 22 extends beyond the N-type dopant region 152 and into the P-type dopant region 155 in an area approximately below the source 110. The depletion profile 22 shown in FIG. 2D is an approximate representation of a depletion profile 22. In some embodiments, the depletion profile 22 can differ from that shown in FIG. 2I) in response to a bias voltage (e.g., a gate-to-source voltage).

Figure 3:
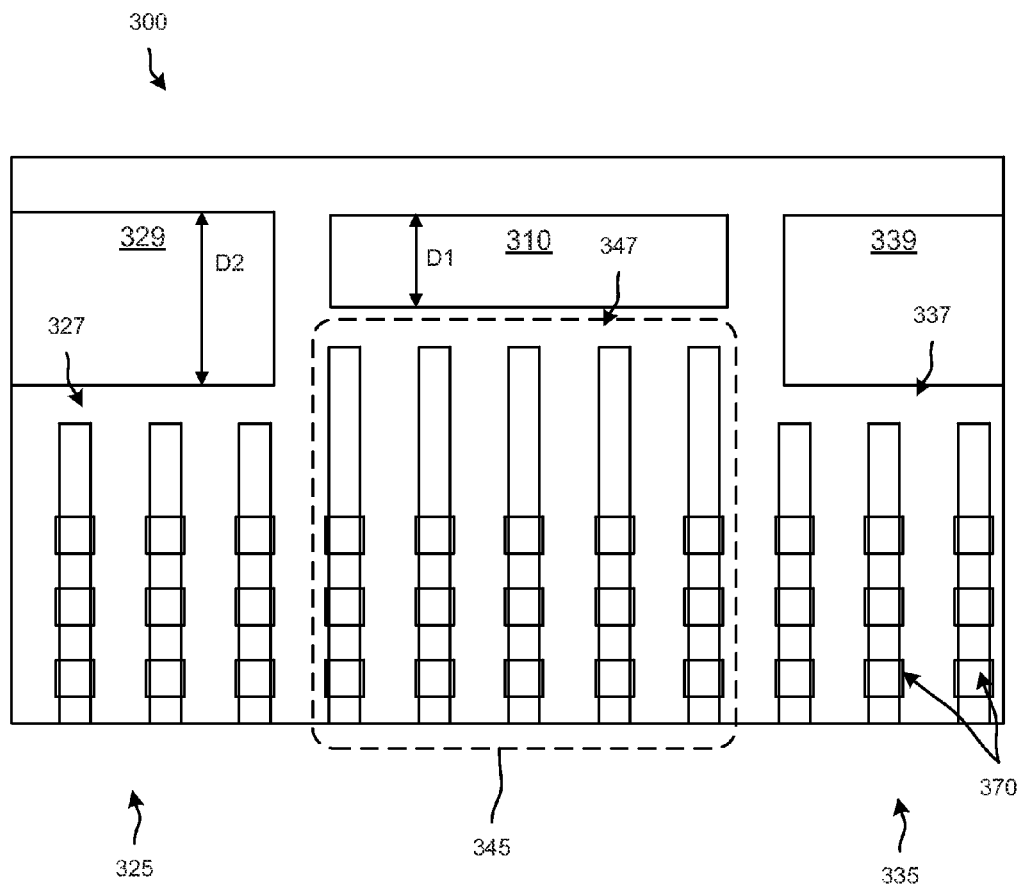
FIG. 3 is a diagram that illustrates at least a portion of a layout of a lateral floating capacitively coupled (LFCC) metal-oxide-semiconductor field-effect transistor (MOSFET) device array including a JFET device, according to an embodiment.

FIG. 3 is a diagram that illustrates at least a portion of a layout of an LFCC MOSFET device array 300 including a JFET device 345, according to an embodiment. In some embodiments, the LFCC MOSFET devices 325, 335 can be double-diffused MOSFET (DMOS) devices. Although not shown in FIG. 3, in some embodiments, the LFCC MOSFET device array 300 can include more than one JFET device. As shown in FIG. 3, the JFET device 345, which is associated with source 310, is integrated into the LFCC MOSFET device array 300 (using features already used within other portions of the LFCC MOSFET device array 300). Portion 325 and portion 335 of the LFCC MOSFET device array 300 are associated with MOSFET sources 329 and 339, respectively. As shown in FIG. 3, the source 310 associated the JFET device 345 has a smaller dimension D1 than dimension D2 of the MOSFET sources 329, 339. Also as shown in FIG. 3, all of the devices included in the LFCC MOSFET device array 300 include capacitively coupled members 370. In this embodiment, the gate (e.g., poly gates) of the JFET device 345 and/or the gate(s) associated with portions 325 and 335 are not shown.

In some embodiments, the capacitively coupled member 370 of the LFCC MOSFET device array 300 can have a volume substantially equal to a volume of one or more of the capacitively coupled members of the JFET device 345. In some embodiments, the capacitively coupled member 370 of the LFCC MOSFET device array 300 can have a volume less than or greater than a volume of one or more of the capacitively coupled members of the JFET device 345.

As shown in FIG. 3, the JFET device 345 is disposed between portion 325 and portion 335 of the LFCC MOSFET device array 300. Accordingly, the JFET device 345 is integrated into the LFCC MOSFET device array 300 (e.g., integrated into an active device region of the LFCC MOSFET device array 300). The trenches 347 of the JFET device 345 are adjacent to (without intervening devices or trenches that are not included in the JFET device 345 or that are LFECC MOSFET devices) the trenches 327 of the portion 325 of the LFCC MOSFET device array 300, and adjacent to (without intervening devices or trenches that are not included in the JFET device 345 or that are LFECC MOSFET devices) to trenches 337 of portion 335 of the LFCC MOSFET device array 300. Also, as shown in FIG. 3, the trenches 347 of the JFET device 345 are approximately parallel to the trenches 327 of the portion 325 of the LFCC MOSFET device array 300 and parallel to trenches 337 of portion 335 of the LFCC MOSFET device array 300. In some embodiments, the trenches 347 of the JFET device 345 can be non-parallel to the trenches 327 of the portion 325 of the LFCC MOSFET device array 300 and/or non-parallel to trenches 337 of portion 335 of the LFCC MOSFET device array 300. In this embodiment, the trenches 347 of the JFET device 345 are slightly longer than the trenches 327 and the trenches 337 of the LFCC MOSFET device array 300. In some embodiments, the LFCC MOSFET device 300 the JFET device 345 within the LFCC MOSFET device array 300) can be relatively high voltage (e.g., greater than 10 volts, 50 volt devices, 100 volt devices).

As illustrated in FIG. 3, the features of the JFET device 345 are similar to, or the same as, the features of the LFCC MOSFET device array 300. As illustrated in FIG. 3, the widths of the trenches 347 of the JFET device 345 are similar to, or the same as, the widths of the trenches 327 and the trenches 337 of the LFCC MOSFET device array 300. Also, the distances (i.e., the mesa region) between the trenches 347 of the JFET device 345 are similar to, or the same as, the distances between the trenches 327 and the trenches 337 of the LFCC MOSFET device array 300. The size, orientation, and/or so forth of the capacitively coupled members 370 of the JFET device 345 are similar to, or the same as, the capacitively coupled members 370 of remaining portions (e.g., portions 325, 335) of the LFCC MOSFET device array 300.

Although not shown in FIG. 3, the device termination for the JFET device 345 and the remaining portions of the LFCC MOSFET device array 300 can be the same (or shared), The JFET device 345 may not have a device termination that is separate from the device termination of the remaining portions of the LFCC MOSFET device array 300. In some embodiments, the device termination can be a device termination for a relatively high-voltage breakdown for the JFET device 345 and for the remaining portions of the LFCC MOSFET device array 300.

In some embodiments, and as discussed above, the JFET device 345 can be processed using the same, or many of the same, process steps (e.g., semiconductor process steps) used to produce (e.g., define, generate) the remaining portions (e.g., portions 325, 335) of the LFCC MOSFET device array 300. However, portions of, for example, the masks that are used to produce the LFCC MOSFET device array 300 can be modified to produce the JFET device 345. For example, a mask that is used to produce a p-body region in portions 325, 335 of the LFCC MOSFET device array 300 can be modified so that the p-body region is not produced (e.g., defined) below (e.g., is excluded from a region below) the source 310 of the JFET device 345. As another example, a mask that is used to produce (e.g., define, generate) the trenches of the LFCC MOSFET device array 300, oxide within the trenches (not shown), and/or so forth, can be modified to produce the differences in lengths (and/or widths) of the trenches 347 compared with the trenches 327, 337. As yet another example, an N-type region between the source 110 and the gate of the JFET device 345 (which can be contiguous) can be produced (e.g., defined, generated) by modifying the trenches of the LFCC MOSFET device array 300, oxide within the trenches (not shown), and/or so forth, can be modified to produce the differences in lengths (and/or widths) of the trenches 347 (associated with the JFET device 345) compared with the trenches 327, 337 (associated with the remaining portions of the LFCC MOSFET device array 300). As yet another example, a width of a trench portion of a gate (not shown) of the JFET device 345 can have a width (e.g., trench width R shown in FIG. 1E) greater than a width of a trench portion of a gate included in portion 325 or portion 335 of the LFCC MOSFET device array 300.

Because the channels of the JFET device 345 are linear (and parallel) channels (e.g., conduction regions), the JFET device can be scaled (e.g., added) in a linear fashion. For example, the current rating (e.g., on-current rating) of the JFET device 345 can be linearly modified by adding or removing channels (by adding or removing one or more of the trenches 347). Other characteristics of the JFET device 345 can similarly be modified in a linear fashion. This is contrasted with a radially configured JFET device (such as that shown in FIG. 5), which may not be linearly scaled in a desirable fashion. As another example, the off-current (Ioff) rating of the JFET device 345 can be linearly modified by adding or removing channels (by adding or removing one or more of the trenches 347). In some embodiments, pinch-off voltage of the JFET device 345 can be defined at an off-current normalized to channel width (e.g., normalized to overall (or combined) channel width of the JFET device 345, normalized to channel width in units such as A/μm).

Figure 4:
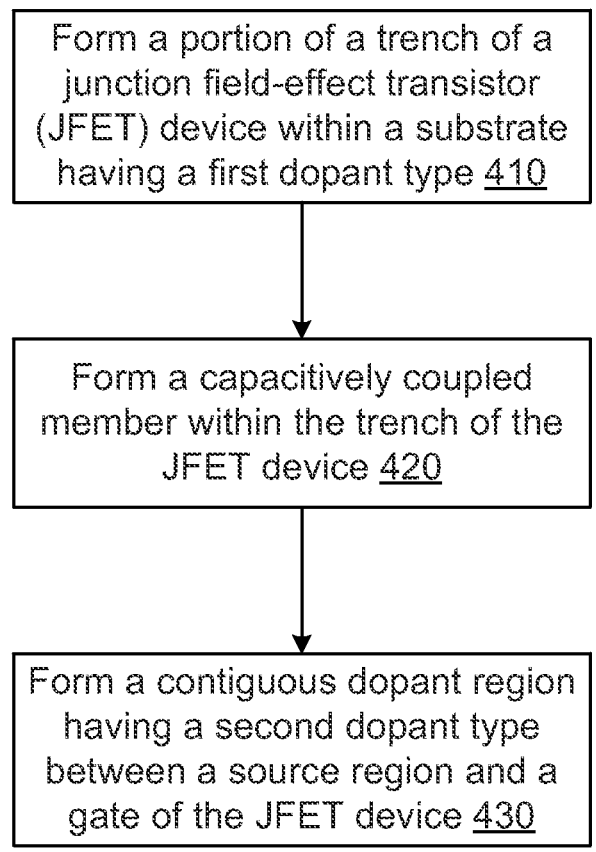
FIG. 4 is a flowchart that illustrates a method for producing a JFET device, according to an embodiment.

FIG. 4 is a flowchart that illustrates a method for producing a junction field-effect transistor (JFET) device, according to an embodiment. In some embodiments, at least some of processing steps illustrated within the flowchart can be used to produce, for example, one or more portions of the JFET device Q1 shown in, for example, FIGS. 1A through 2D.

Form a portion of a trench of a junction field-effect transistor (JFET) device within a substrate having a first dopant type (410). In some embodiments, the substrate can include, or can be part of, an epitaxial layer of a semiconductor. In some embodiments, the first dopant type can be a P-type dopant. In some embodiments, the trench of the JFET device can be formed while (e.g., concurrent with) trenches of other types of devices such as metal-oxide-semiconductor field-effect transistor MOSFET devices (e.g., DMOS devices) are being formed within an array.

Form a capacitively coupled member within the trench of the JFET device (420). In some embodiments, the capacitively coupled member can be made of a conductive material (e.g., metallic material, a polysilicon material). In some embodiments, the capacitively coupled member can be formed within the trench after an insulating layer (e.g., an oxide layer) has been formed within the trench of the JFET device. In some embodiments, a trench portion of a gate can be formed of the same material as the capacitively coupled member when the capacitively coupled member is formed within the trench of the JFET device. In some embodiments, the trench portion of a gate can be formed of a different material from the capacitively coupled member before or after the capacitively coupled member is formed.

Form a contiguous dopant region having a second dopant type between a source region and a gate of the JFET device (430). The contiguous dopant region may exclude a doped body region (e.g., a. P-type body region) separating (e.g., electrically isolating, disposed between) the source region and the gate. In some embodiments, the second dopant type can be an N-type dopant. In some embodiments, the dopant region can be formed before or after at least a portion of the gate and/or a gate oxide has been formed. In some embodiments, the dopant region can be formed before or after at least portion of the source has been formed. In some embodiments, the dopant region can be disposed below a gate oxide of the gate of the JFET device.

Figure 5:
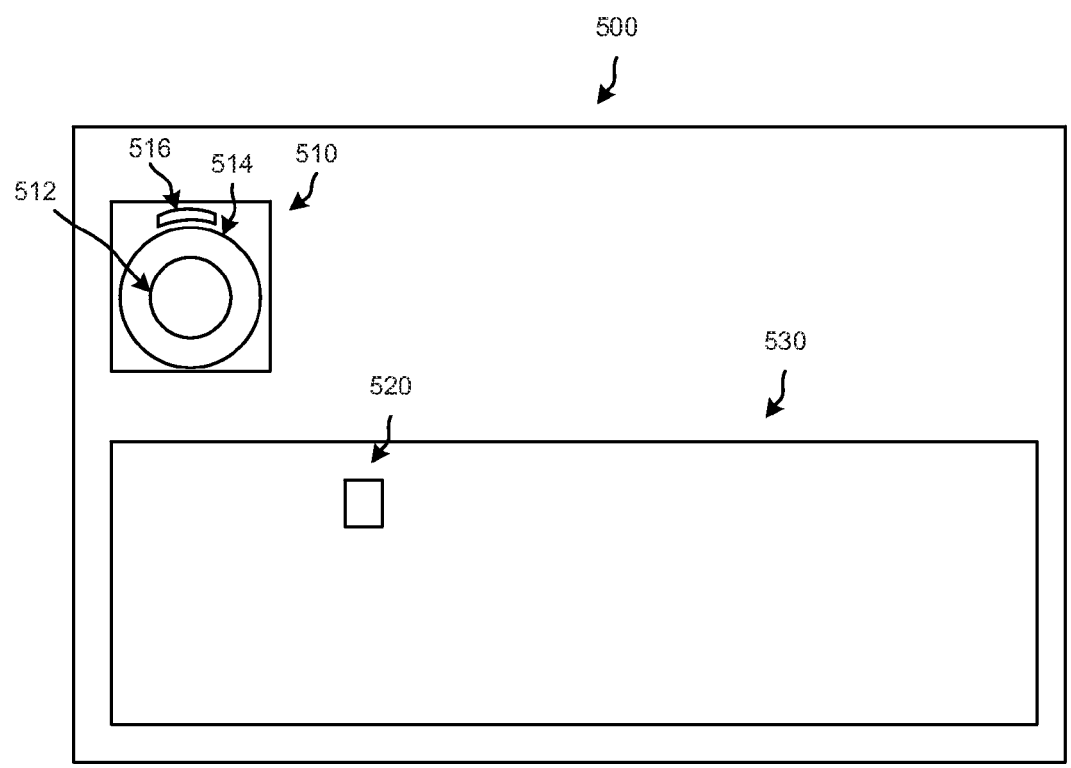
FIG. 5 is a diagram that illustrates a top view of elements included in a portion of a semiconductor die, according to an embodiment.

FIG. 5 is a diagram that illustrates a top view of elements included in a portion 500 of a semiconductor die, according to an embodiment. In this embodiment, a traditional JFET device 510 (e.g., a traditional high-voltage (HV) JFET device) includes a source 516, a drain 512 having a circular shape, and a gate 514 having a circular shape. In some embodiments, the traditional JFET device 510 can be formed using a drain having an oval shape and/or a gate having an oval-shaped. A current can flow from the source 516 to the drain 512 via the gate 514 when the traditional JFET device 510 is in a conducting state.

The relative area of a JFET device 520 (e.g., a high-voltage (HV) JFET device) included in a MOSFET array 530 is illustrated in FIG. 5. The individual features of the JFET device (such as trenches, a gate, a source, etc.) are not shown. The JFET device 520 can be similar to the JFET device Q1 described in connection with FIGS. 1A through 2C, the JFET device 345 shown in FIG. 3, and/or so forth. As shown in FIG. 5, the JFET device 520 included in the MOSFET array 530 has an area that is approximately 10 times smaller than the area of the traditional JFET device 510. Even though the JFET device 520 included in the MOSFET array 530 has an area that is smaller than the area of the traditional JFET device 510, the JFET device 520 included in the MOSFET array 530 has characteristics that are similar to the characteristics of the traditional JFET device 510. For example, the current density rating, the breakdown voltage, saturation current, and/or so forth of the JFET device 520 can be the same as or similar to that of the traditional JFET device 510 even though the JFET device 520 is smaller (e.g., 10 times smaller, 5 times smaller) than the traditional JFET device 510.

Use of the JFET device 520, instead of the traditional JFET device 510, within a semiconductor device can result in a smaller overall semiconductor device area (and cost). In some embodiments, use of the JFET device 520, instead of the traditional JFET device 510, within a semiconductor device can result in a smaller overall semiconductor device area without (or substantially without) compromising JFET behavior in an undesirable fashion.

Figure 6:
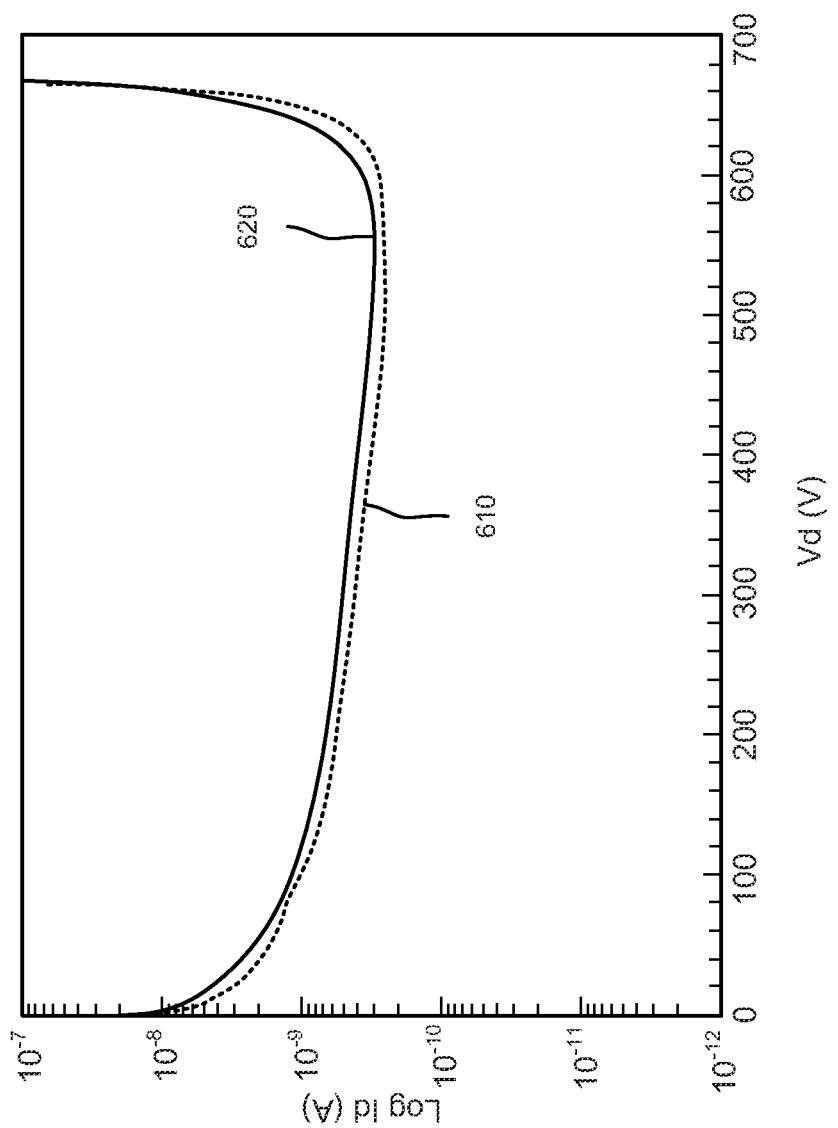
FIG. 6 is a graph that illustrates a breakdown characteristic of a JFET device and a breakdown characteristic of a double-diffused MOSFET (DMOS) device, according to an embodiment.

FIG. 6 is a graph that illustrates a breakdown characteristic 6110 of a JFET device and a breakdown characteristic 620 of a DMOS device (e.g., an LFCC DMOS device), according to an embodiment. The JFET device can be included in (e.g., integrated into) a device array also including the DMOS device. The breakdown characteristic 610 of the JFET device can be a drain-to-gate breakdown voltage, and the breakdown characteristic 620 of the DMOS device can be a drain-to-source breakdown voltage. The log of the drain current (Log Id) in amperes (A) is shown on the y-axis, and the drain voltage (Vd) in volts (V) is shown on the x-axis. The JFET device 610 can be formed within an array also including the DMOS device. Accordingly, the dimensions of the DMOS device can be similar to the dimensions of the JFET device. As shown in FIG. 6, the breakdown characteristic 610 of the JFET device is nearly the same as the breakdown characteristic 620 of the DMOS device. In some embodiments, the breakdown characteristic 610 of the JFET device can be exactly the same as the breakdown characteristic 620 of the DMOS device. The breakdown characteristic 610 of the JFET device is based on a biased condition of a gate voltage of 0 V and a source voltage that is open.

Figure 7:
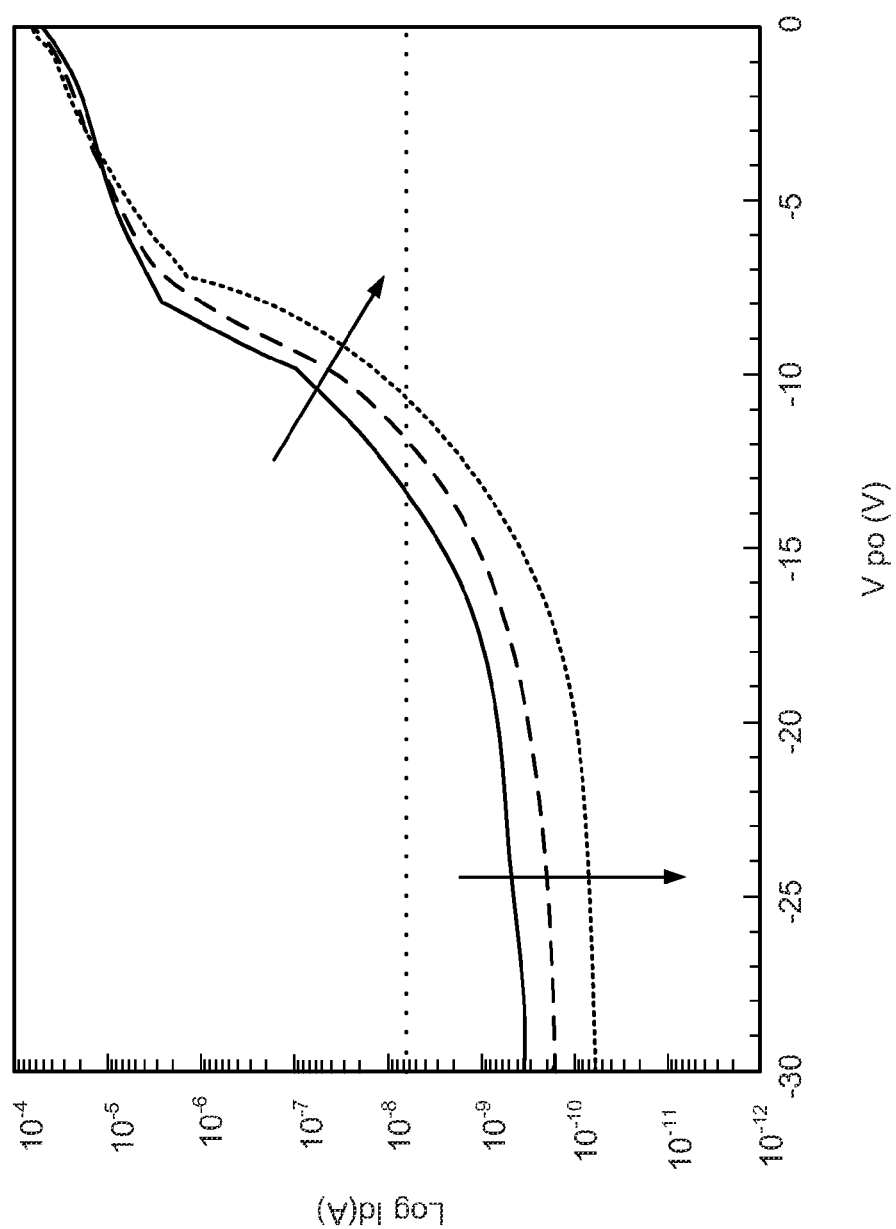
FIG. 7 is a graph that illustrates behavior of a JFET device with a change in a width of a trench gate portion.

FIG. 7 is a graph that illustrates behavior of a JFET device with a change in a width of a trench gate portion (e.g., trench width R of the trench portion 124 shown in FIG. 1E). In this embodiment, the log of the drain current (Log Id) in amperes (A) is shown on the y-axis, and the pinch-off voltage (Vpo) in volts (V) is shown on the x-axis. In this embodiment, a constant drain-to-source voltage (Vds) of 100 V is applied to the JFET device. In this embodiment, the pinch-off voltage is specified to occur at a current of approximately 3.3 nA/µm, which is illustrated by the horizontal straight dotted line in FIG. 7. The arrows shown in FIG. 7 illustrate increasing trench gate portion width. As shown in FIG. 7, increasing trench gate portion width results in a decrease in pinch-off voltage of the JFET device. In this embodiment, the pinch-off voltage varies between approximately −10 V and −14 V (shown by the intersection between the curves and the specified pinch off condition) depending on trench gate portion width.

Figure 8:
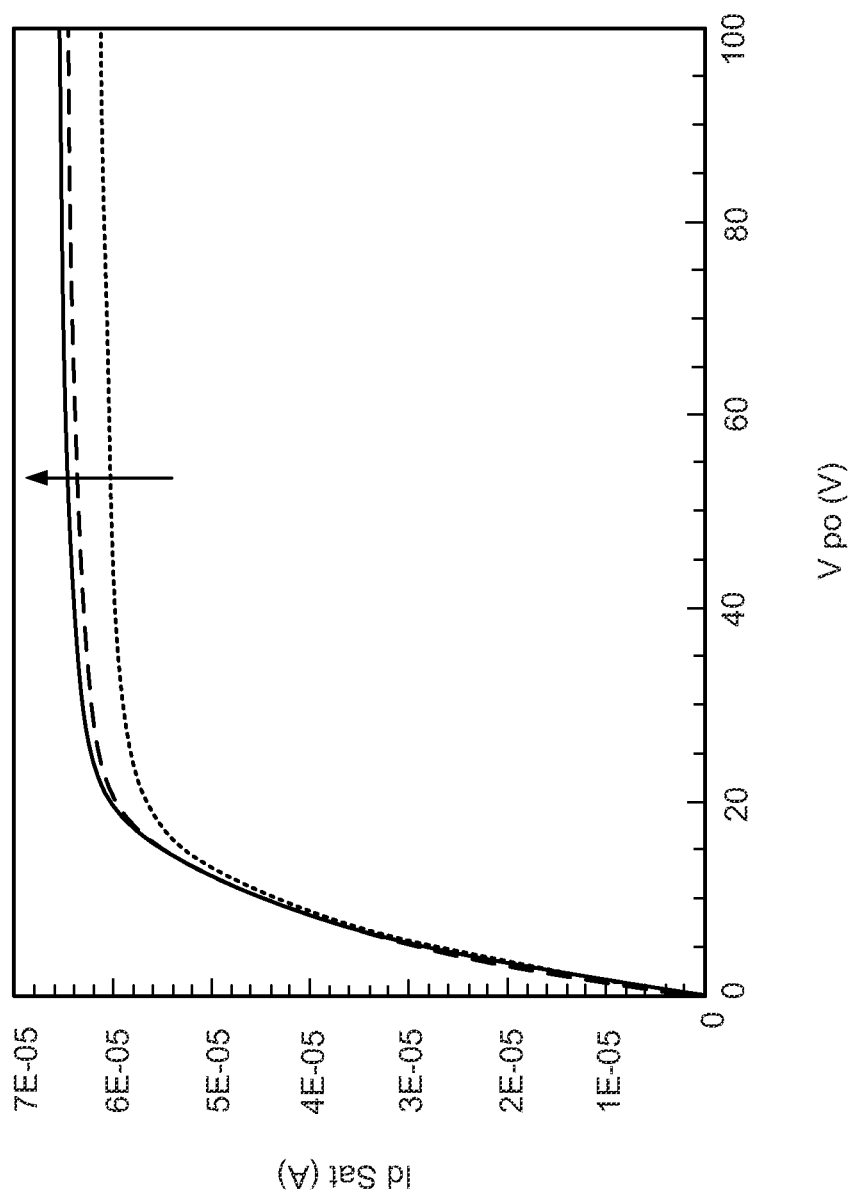
FIG. 8 is another graph that illustrates behavior of a JFET device with a change in a width of a trench gate portion.

FIG. 8 is another graph that illustrates behavior of a JFET device with a change in a width of a trench gate portion (e.g., trench width R of the trench portion 124 shown in FIG. 1E). In this embodiment, the saturation drain current (Id Sat) in amperes (A) is shown on the y-axis, and the pinch-off voltage (Vpo) volts (V) is shown on the x-axis. In this embodiment, a constant gate-to-source voltage (Vgs) of 0 V is applied to the JFET device. The arrows shown in FIG. 8 illustrate increasing trench gate portion width. As shown in FIG. 8, increasing trench gate portion width results in an increase in saturation drain current of the JFET device.

In one general aspect, a semiconductor device can include a gate having a trench portion disposed within a trench of a junction field-effect transistor device and defining at least a portion of a boundary of an interior region. The semiconductor device can also include a dopant region disposed within the interior region and configured to change to a depleted state in response to a bias voltage less than a threshold voltage being applied to the gate.

In another general aspect, an apparatus can include a gate having a trench portion disposed within a trench of a junction field-effect transistor device, and a member disposed within the trench and capacitively coupled to the trench portion of the gate. The member can have a width less than a width of the trench portion of the gate. The apparatus can also include a dopant region configured to change to a depleted state in response to a gate-source voltage less than a threshold voltage being applied to the gate.

In another general aspect, a semiconductor device can include a gate having a first trench portion disposed within a first trench of a junction field-effect transistor device, a second trench portion disposed within a second trench of the junction field-effect transistor device, and a top portion coupled to both the first trench portion and to the second trench portion. The semiconductor device can include a mesa region disposed between the first trench and the second trench, and including a single PN junction defined by an interface between a substrate dopant region having a first dopant type and a channel dopant region having a second dopant type.

In some embodiments, the first trench portion of the gate and the second trench portion of the gate define opposing side walls of an interior region including the mesa region. In some embodiments, the top portion of the gate is aligned orthogonal to at least one of the first trench portion of the gate or the second trench portion of the gate. In some embodiments, the semiconductor device can include at least one capacitively coupled member disposed within at least one of the first trench or the second trench of the junction field-effect transistor.

In some embodiments, the channel dopant region is disposed between the top portion of the gate and the substrate dopant region. In some embodiments, the channel dopant region is configured to change to a depleted state in response to a bias voltage less than a threshold voltage being applied to the gate. In some embodiments, the semiconductor device can include a gate oxide disposed between the top portion of the gate and the mesa region where the channel dopant region is continuously doped with the second dopant type between the gate oxide and the substrate dopant region. In some embodiments, the junction field-effect transistor is integrated with a lateral floating capacitively coupled (LFCC) metal-oxide-semiconductor field-effect transistor (MOSFET) device.

In some embodiments, at least one of the first trench or the second trench of the junction field-effect transistor is adjacent to a trench of a lateral floating capacitively coupled (LFCC) metal-oxide-semiconductor field-effect transistor (MOSFET) device. In some embodiments, the first trench portion, the second trench portion, and the top portion collectively define an arch shape.

In another general aspect, an apparatus can include a source, and a gate electrically isolated from the source where the gate has a trench portion disposed within a first trench of a junction field-effect transistor device and has a trench portion disposed within a second trench of the junction field-effect transistor device. The apparatus can include a member disposed within the first trench and capacitively coupled to the trench portion of the gate disposed within the first trench. The member can have a trench width less than a trench width of the trench portion of the gate disposed within the first trench, and a channel dopant region in contact with the source and continuously extending into a mesa region disposed between the first trench and the second trench.

In some embodiments, the member is a first member, and the apparatus can include a trench of a lateral floating capacitively coupled (LFCC) metal-oxide-semiconductor field-effect transistor (MOSFET) device adjacent to the first trench of the junction field-effect transistor. The apparatus can include a second member disposed within the trench of the LFCC MOSFET device and having a volume substantially equal to a volume of the first member disposed within the first trench of the of the junction field-effect transistor device.

In some embodiments, the channel dopant region has a conducting portion with a cross-sectional perimeter that decreases as the channel dopant region changes from a conducting state to a depleted state. In some embodiments, the first trench portion and the second trench portion define at least a portion of a boundary of an interior region, the channel dopant region is disposed within the interior region. In some embodiments, the channel dopant region is configured to change to a depleted state in response to a gate-source voltage less than a threshold voltage being applied between the source and the gate.

In yet another general aspect, an apparatus can include a gate of a junction field-effect transistor coupled to a gate oxide, and a P-type substrate of the junction field-effect transistor. The apparatus can also include an N-type dopant region disposed between the gate oxide and the P-type substrate where the N-type dopant region is in contact with the gate oxide.

In some embodiments, the N-type dopant region has a conducting portion configured to be constricted radially so that a pinch off point of the conducting portion of the N-type dopant region has a circular cross section. In some embodiments, the apparatus can include a source in contact with and electrically coupled to the N-type dopant region. In some embodiments, the N-type dopant region is configured to change from a conducting state to a depleted state in response to a gate-source voltage less than a threshold voltage being applied to the gate. In some embodiments, the N-type dopant region is configured to change from a conducting state to a depleted state and holes are configured to accumulate at a junction between the N-type dopant region and the P-type substrate in response to a gate-source voltage less than a threshold voltage being applied to the gate.

Implementations of the various techniques described herein may be implemented in digital electronic circuitry, or in computer hardware, firmware, software, or in combinations of them. Some implementations may be implemented using various semiconductor processing and/or packaging techniques. As discussed above, some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A semiconductor device, comprising:
   a gate having a first trench portion disposed within a first trench of a junction field-effect transistor device, a second trench portion disposed within a second trench of the junction field-effect transistor device, and a top portion coupled to both the first trench portion and to the second trench portion;
   a mesa region disposed between the first trench and the second trench, and including a single PN junction defined by an interface between a substrate dopant region having a first dopant type and a channel dopant region having a second dopant type;
   a first conductive member disposed within at least one of the first trench or the second trench of the junction field-effect transistor, the first conductive member being capacitively coupled with the gate; and
   a second conductive member disposed within at least one of the first trench or the second trench, the second conductive member being physically isolated from the first conductive member by an oxide.

2. The semiconductor device of claim 1, wherein the first trench portion of the gate and the second trench portion of the gate define opposing side walls of an interior region including the mesa region.

3. The semiconductor device of claim 1, wherein the top portion of the gate is aligned orthogonal to at least one of the first trench portion of the gate or the second trench portion of the gate.

4. The semiconductor device of claim 1, wherein the channel dopant region is disposed between the top portion of the gate and the substrate dopant region.

5. The semiconductor device of claim 1, wherein the channel dopant region is configured to change to a depleted state in response to a bias voltage less than a threshold voltage being applied to the gate.

6. The semiconductor device of claim 1, further comprising:
   a gate oxide disposed between the top portion of the gate and the mesa region, the channel dopant region being continuously doped with the second dopant type between the gate oxide and the substrate dopant region.

7. The semiconductor device of claim 1, wherein the junction field-effect transistor is integrated with a lateral floating capacitively coupled (LFCC) metal-oxide-semiconductor field-effect transistor (MOSFET) device.

8. The semiconductor device of claim 1, wherein at least one of the first trench or the second trench of the junction field-effect transistor is adjacent to a trench of a lateral floating capacitively coupled (LFCC) metal-oxide-semiconductor field-effect transistor (MOSFET) device.

9. The semiconductor device of claim 1, wherein the first trench portion, the second trench portion, and the top portion collectively define an arch shape.

10. An apparatus, comprising:
    a source;
    a gate electrically isolated from the source, the gate having a trench portion disposed within a first trench of a junction field-effect transistor device and having a trench portion disposed within a second trench of the junction field-effect transistor device;
    a conductive member disposed within the first trench, the conductive member being capacitively coupled to the trench portion of the gate disposed within the first trench, the conductive member having a trench width less than a trench width of the trench portion of the gate disposed within the first trench; and
    a channel dopant region in contact with the source and continuously extending into a mesa region disposed between the first trench and the second trench.

11. The apparatus of claim 10, wherein the conductive member is a first conductive member,
    the apparatus, further comprising:
    a trench of a lateral floating capacitively coupled (LFCC) metal-oxide-semiconductor field-effect transistor (MOSFET) device adjacent to the first trench of the junction field-effect transistor; and a second conductive member disposed within the trench of the LFCC MOSFET device and having a volume substantially equal to a volume of the first conductive member disposed within the first trench of the of the junction field-effect transistor device.

12. The apparatus of claim 10, wherein the channel dopant region has a conducting portion with a cross-sectional perimeter that decreases as the channel dopant region changes from a conducting state to a depleted state.

13. The apparatus of claim 10, wherein the first trench portion and the second trench portion define at least a portion of a boundary of an interior region, the channel dopant region is disposed within the interior region.

14. The apparatus of claim 10, wherein the channel dopant region is configured to change to a depleted state in response to a gate-source voltage less than a threshold voltage being applied between the source and the gate.

15. An apparatus, comprising:
a gate of a junction field-effect transistor coupled to a gate oxide;
a P-type substrate of the junction field-effect transistor;
an N-type dopant lateral conduction region disposed between the gate oxide and the P-type substrate, the N-type dopant region being in contact with the gate oxide; and
a trench having a conductive member disposed therein, the conductive member being capacitively coupled with the gate.

16. The apparatus of claim 15, wherein the N-type dopant lateral conduction region has a conducting portion configured to be constricted radially so that a pinch off point of the conducting portion of the N-type dopant lateral conduction region has a circular cross section.

17. The apparatus of claim 15, further comprising:
a source being in contact with and electrically coupled to the N-type dopant lateral conduction region.

18. The apparatus of claim 15, wherein the N-type dopant lateral conduction region is configured to change from a conducting state to a depleted state in response to a gate-source voltage less than a threshold voltage being applied to the gate.

19. The apparatus of claim 15, wherein the N-type dopant lateral conduction region is configured to change from a conducting state to a depleted state and holes are configured to accumulate at a junction between the N-type dopant lateral conduction region and the P-type substrate in response to a gate-source voltage less than a threshold voltage being applied to the gate.

20. The apparatus of claim 15, wherein the conductive member is a first conductive member, the apparatus further comprising a second conductive member disposed in the trench, the second conductive member being isolated from the first conductive member by an oxide.

21. The apparatus of claim 15, wherein the trench is a first trench, the apparatus further comprising:
a source;
a second trench; and
a mesa region disposed between the first trench and the second trench, the N-type dopant lateral conduction region being in contact with the source and continuously extending into the mesa region.

* * * * *

UNITED STATES PATENT AND TRADEMARK OFFICE
CERTIFICATE OF CORRECTION

| | |
|---|---|
| PATENT NO. | : 8,704,296 B2 |
| APPLICATION NO. | : 13/408212 |
| DATED | : April 22, 2014 |
| INVENTOR(S) | : Robert Kuo-Chang Yang et al. |

Page 1 of 1

It is certified that error appears in the above-identified patent and that said Letters Patent is hereby corrected as shown below:

In the Claims:

In column 17, line 4, in claim 11, after "trench" delete "of the".

Signed and Sealed this
Fifteenth Day of July, 2014

Michelle K. Lee
*Deputy Director of the United States Patent and Trademark Office*